(12) United States Patent
Lee et al.

(10) Patent No.: US 9,567,515 B2
(45) Date of Patent: Feb. 14, 2017

(54) WHITE LIGHT EMITTING DEVICE AND MANUFACTURING METHOD THEREOF

(75) Inventors: Sung Eun Lee, Seoul (KR); Hee Jung Kim, Seoul (KR); Chang Seo Park, Seoul (KR)

(73) Assignee: LG ELECTRONICS, INC., Seoul (KR)

( * ) Notice: Subject to any disclaimer, the term of this patent is extended or adjusted under 35 U.S.C. 154(b) by 469 days.

(21) Appl. No.: 11/232,966

(22) Filed: Sep. 23, 2005

(65) Prior Publication Data

US 2006/0065907 A1  Mar. 30, 2006

(30) Foreign Application Priority Data

Sep. 24, 2004 (KR) .................. 10-2004-0077466

(51) Int. Cl.
*H01L 33/00* (2010.01)
*C09K 11/06* (2006.01)
(Continued)

(52) U.S. Cl.
CPC ............ *C09K 11/06* (2013.01); *C09K 11/7734* (2013.01); *C09K 11/7774* (2013.01);
(Continued)

(58) Field of Classification Search
CPC ...... H01L 33/502; H01L 33/56; H01L 25/167; H01L 33/44; H01L 2933/0041; H01L 31/0203; H01L 33/52; H01L 21/02126; H01L 21/02216; H01L 21/02282; H01L 21/3122; H01L 23/293
(Continued)

(56) References Cited

U.S. PATENT DOCUMENTS 6,570,322 B1 * 5/2003 Rasmussen .................. 313/496
6,600,175 B1 * 7/2003 Baretz et al. ................. 257/100
(Continued)

FOREIGN PATENT DOCUMENTS

JP  2001271095 A  * 10/2001
KR  2003-0031061  4/2003
(Continued)

OTHER PUBLICATIONS

Y. Sato et al. "Properties of full-color fluorescent display devices excited by a UV light emitting diode," Jpn. J. Appl. Phys. vol. 37 (1998), pp. L129-L131.*
(Continued)

*Primary Examiner* — Meiya Li
(74) *Attorney, Agent, or Firm* — Dentons US LLP

(57) ABSTRACT

A white light emitting device (LED) and a manufacturing method thereof wherein an LED coated with polymeric resin in which organic phosphors are solved dissolved and inorganic phosphors are dispersed creates a white LED, thereby producing an effect of excellent luminance and color coordinate without creating a compatibility problem with the polymeric resin. The present invention creates a white LED with a high luminance and a long service life using polymeric composition containing organic and inorganic phosphors, organic and inorganic combined phosphors and organosilicates, and an epoch making improvement in terms of luminance and credibility without additional process added to an existing element fabricating process, thereby enabling to achieve price competitiveness through cost reduction.

5 Claims, 15 Drawing Sheets

(51) Int. Cl.
   *C09K 11/77* (2006.01)
   *H05B 33/14* (2006.01)
   *H01L 33/50* (2010.01)

(52) U.S. Cl.
   CPC ........... *H01L 33/504* (2013.01); *H05B 33/14* (2013.01); *C09K 2211/1007* (2013.01); *C09K 2211/1014* (2013.01); *C09K 2211/1029* (2013.01); *C09K 2211/1033* (2013.01); *C09K 2211/1088* (2013.01); *C09K 2211/1416* (2013.01); *C09K 2211/1425* (2013.01); *C09K 2211/1433* (2013.01); *C09K 2211/1483* (2013.01); *H01L 33/502* (2013.01); *H01L 2224/48091* (2013.01); *H01L 2224/48247* (2013.01); *H01L 2224/48257* (2013.01); *Y02B 20/181* (2013.01)

(58) Field of Classification Search
   USPC ............ 257/98–100, 49, E33.059, E33.061, 257/E21.001, E29.094, 4; 313/501, 502, 313/504
   See application file for complete search history.

(56) References Cited

U.S. PATENT DOCUMENTS

| | | | |
|---|---|---|---|
| 6,812,551 B2* | 11/2004 | Hawker et al. | 257/632 |
| 7,192,795 B2* | 3/2007 | Boardman et al. | 438/22 |
| 2002/0171911 A1* | 11/2002 | Maegawa | 359/308 |
| 2003/0020088 A1* | 1/2003 | Seo et al. | 257/103 |
| 2003/0122482 A1* | 7/2003 | Yamanaka et al. | 313/512 |
| 2003/0124564 A1* | 7/2003 | Trau et al. | 435/6 |
| 2003/0129530 A1* | 7/2003 | Leinenbach et al. | 430/270.1 |
| 2003/0214233 A1* | 11/2003 | Takahashi et al. | 313/512 |
| 2003/0227249 A1* | 12/2003 | Mueller et al. | 313/491 |
| 2004/0000855 A1* | 1/2004 | Benigni et al. | 313/402 |
| 2004/0051111 A1* | 3/2004 | Ota et al. | 257/98 |
| 2004/0052714 A1* | 3/2004 | Rojas et al. | 423/335 |
| 2005/0116635 A1* | 6/2005 | Walson et al. | 313/512 |
| 2006/0038198 A1* | 2/2006 | Chua et al. | 257/100 |
| 2006/0063289 A1* | 3/2006 | Negley et al. | 438/26 |

FOREIGN PATENT DOCUMENTS

| | | |
|---|---|---|
| KR | 2003-0031061 A | 4/2003 |
| KR | 2004-80474 A | 9/2004 |

OTHER PUBLICATIONS

E. J. A. Pope, "Florescence behavior of organic, dyes, Europium, and Uranium in Sol-Gel microsphoeres", SPIE vol. 1758 Sol-Gel Optics II, 1992, pp. 360-370.*

* cited by examiner

ORANGE & RED GROUP

GREEN & BLUE GROUP

WHITE LIGHT EMITTING DEVICE AND MANUFACTURING METHOD THEREOF

This application claims the benefit of Korean Patent Application No. 2004-0077466, filed on Sep. 24, 2004, which is hereby incorporated by reference for all purposes as if fully set forth herein.

BACKGROUND OF THE INVENTION

Field of the Invention

The present invention relates to a white light emitting device and a manufacturing method thereof. More particularly, the present invention relates to a white light emitting device and a manufacturing method thereof configured to embody a white light emitting device by having organic phosphors dissolved, inorganic phosphors-dispersed high molecular resin coated on a light emitting diode, thereby accomplishing an excellent luminous efficiency and color coordinate without creating a compatibility problem with coating resin.

Description of the Prior Art

In general, a light emitting device (hereinafter generally referred to as LED) has a small size, high efficiency, can emit bright color, and as a semiconductor element, is not vulnerable to breakage. Also, it has excellent initial driving characteristics and vibration resistance. Furthermore, it can withstand repeated ON/OFF cycling. Consequently, the LEDs have been widely used as various types of indicators and light sources.

Recently, LEDs of red, green and blue colors with high luminance and high efficiency have been developed, and these LEDs have been used in manufacturing large size LED displays. Such LED displays can operate at low power, have light weight, and long service life. In order to use LEDs to get white light, since LEDs have monochromatic peak wavelength, three LEDs of red, green and blue, each arranged adjacent to each other, have been used in combination to diffuse and blend their colors into white.

In addition, recently, efforts have been made to create individual LEDs which emit white light. However, hue and luminance of each LED are irregular to make it difficult to obtain a desired white light.

Another problem is that, because respective red, green and blue LEDs for creating the white light are manufactured with different materials, a driving circuit becomes complicated due to different driving voltages of respective LEDs.

There are other problems in that because, each suitable LED is typically constructed of a semiconductor epistructure light emitting element set in a cup on the tip of a lead frame, temperature characteristics thereof are different and hues are changed with respect to environment, it is difficult to uniformly mix the lights created by each LED and there are many cases of created high intensity spots. In other words, it should be admitted as a fact that it is difficult to obtain a satisfactory result of creating a white light through mixture of three colors.

In order to address the afore-mentioned problems, there is used a method of a light emitting element for emitting a particular wavelength being absorbed by a phosphor contained in a resin molding that covers the light emitting element. The said method is to create a white light by causing the phosphor to absorb lights emitted by the LED and to emit a light of different wavelength.

In other words, the light emitting element emits blue light and the phosphor absorbs the emitted blue light and emits yellow light. The combination of yellow phosphor light and blue light emitting element makes it possible to manufacture an LED that can emit white light.

Furthermore, a system is employed where an LED of ultraviolet band is used and three different color-emitting phosphors (e.g., red, green and blue) are blended to induce a light emission from an entire visible light region, thereby enabling to obtain white light.

However, if only an inorganic yellow phosphor system ("YAG: Ce") is used, a halo effect may be produced by wavelength separation phenomenon caused by a narrow peak of blue wavelength region and a wide peak of yellow wavelength, making it difficult to create white light. Most of the hitherto known methods employ the inorganic phosphor system.

FIG. 1 is a schematic drawing of inorganic phosphor particle-dispersed resin which is coated on an LED for creating a light emitting element according to the prior art, where the LED is conventionally bonded to a reflector plate of a lead frame and packaged.

At this time, if an LED (10) emitting blue light is set in a cup-shaped reflector plate (21) on the tip of a lead frame (20), white light can be created by the reflector plate (21) being coated with inorganic phosphor particle (31)-dispersed resin (30) for encompassing the LED (10). In other words, the blue light emitted from the LED (10) is discharged outside as white light via the yellow inorganic phosphor particles (31). The inorganic phosphor uses polymeric dispersion system such that it is inevitable to suffer from disadvantages of luminance loss caused by scatter with regard to dispersion of particles and absorption of molecules.

Another disadvantage is that surface treatment is essential for preventing cohesion of particles and efficiency decreases due to clod of particles as time goes by.

Referring again to FIG. 1, if there is no uniform dispersion, no uniform luminance can be expected, and a serious problem occurs as the degree of phosphor content is enlarged, thereby resulting in creation of color spot and constituting a factor of causing a decreased efficiency of elements in the long run.

FIG. 2 is a fabricating process flow chart of a white LED according to the prior art, which is disclosed in Korea laid open Patent No. 2003-31061.

First of all, a lead frame having a plurality of terminals is packaged with one or more LED chips for electrical contact. (S10). The metal terminals of the lead frame and the LED chips are electrically connected via a bond wire (S20). Successively, granular inorganic phosphor and liquid organic phosphor are blended (S30), and the blended phosphors are mixed with resin composition (S40). The mixed resin is coated on the LED chips and hermetically sealed (S50). Next, the resin is hardened (S60).

The light emitted from the said LED passes a light converting layer composed of the mixed resin composition and is converted to white light and discharged outside to become a LED emitting white light.

However, various problematics may arise in the prior art thus described because the organic phosphors are dissolved in separate liquid resin to form liquid organic phosphors.

First of all, there may be a problem in compatibility with the coating resin, and because of difference in solubility, and if dispersed in the coating resin, a crystallinity phenomenon occurs, making it difficult to obtain a uniform dispersion system. Furthermore, after the coating, residual solution or liquid resins each having a different property may result in creation of air bubbles or cracks during the hardening process.

If an organic phosphor of low solubility is employed, an amount of solvent is increased to result in a low viscosity of coating resin such that it is difficult to unify the coated amount to an LED per lot, and the coated amount varies in response to the degree of the solvent being volatilized, making it difficult to obtain a uniform luminance effect and color coordinate.

Furthermore, the addition of phosphors to an LED results in a relatively costly manufacturing process that yields separate solution process and a mixing process.

In addition, the said organic phosphors which are not composed of pure organic phosphors may contain foreign objects to reduce the luminance efficiency.

Consequently, the method of mixing the liquid organic phosphors with separate coating resin as disclosed in the prior art of Korean Patent Laid-open Publication No. 2003-0031061 is deemed to be inadequate and has created the aforementioned problems.

SUMMARY OF THE INVENTION

The present invention is conceived to solve the aforementioned problems and it is an object of the present invention to provide a white LED and a manufacturing method thereof configured to coat organic phosphor dissolved, inorganic phosphor-dispersed polymeric resin on an LED to create a white LED such that there arises no compatibility with the coating resin to obtain an excellent luminance efficiency and color coordinate.

It is another object of the present invention to provide a white LED and a manufacturing method thereof configured to further contain an organosilicate in the polymeric resin containing phosphors to thereby prevent degradation of the phosphors and to improve the credibility.

In accordance with a first aspect of the present resin encompassing the LED, the LED being coated with the polymeric resin, in which organic phosphors are dissolved and inorganic phosphors are dispersed.

In accordance with a second aspect of the present invention, the white LED comprises: an LED; and polymeric resin encompassing the LED, the LED being coated with the polymeric resin, in which phosphors and organosilicate are contained.

In accordance with a third aspect of the present invention, a white LED comprises: a lead frame having a pair of external lead terminals, each spaced a predetermined distance apart, and one tip end of the external lead terminal being formed with a cup-shaped reflector plate; a LED bonded to the reflector plate of the lead frame; a wire electrically connecting the LED to a pair of external lead terminals of the lead frame; polymeric resin encompassing the LED and coated with the reflector plate and in which organic phosphors are dissolved and inorganic phosphors are dispersed; and a molding part so molded as to encompass the polymeric resin, the entire length of the wire and part of the lead frame.

In accordance with a fourth aspect of the present invention, a manufacturing method of a white LED comprises the steps of: bonding an LED to a reflector plate of a lead frame formed with a pair of external lead terminals, each spaced a predetermined distance apart, and with the cup-shaped reflector plate at one tip end of an external lead terminal; bonding the LED to the lead frame with a wire; coating to the reflector plate of the lead frame a polymeric resin in which organic phosphors are dissolved and inorganic phosphors are dispersed to encompass the LED; and implementing a molding process of encompassing a part of the lead frame with a transparent material for protecting the LED from the outside environment.

In accordance with a fifth aspect of the present invention, a method of manufacturing a white LED comprises the steps of: dissolving organic phosphors and organosilicates in polymeric resin; dispersing inorganic phosphors in the polymeric resin dissolved therein with the organic phosphors and the organosilicates; and encompassing an LED with the polymeric resin dissolved therein with the organic phosphors and the organosilicates and dispersed therein with inorganic phosphors and coating the LED with the polymeric resin.

DETAILED DESCRIPTION OF THE INVENTION

Now, preferred embodiments of the present invention will be described in detail with reference to the accompanying drawings.

Figure 1:
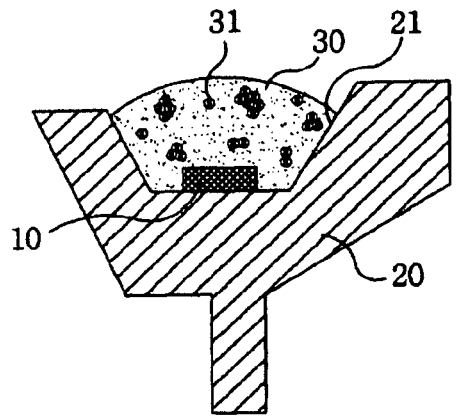
FIG. 1 is a schematic drawing of inorganic phosphor particle-dispersed resin which is coated on an LED for creating a light emitting element according to the prior art.
Figure 2:
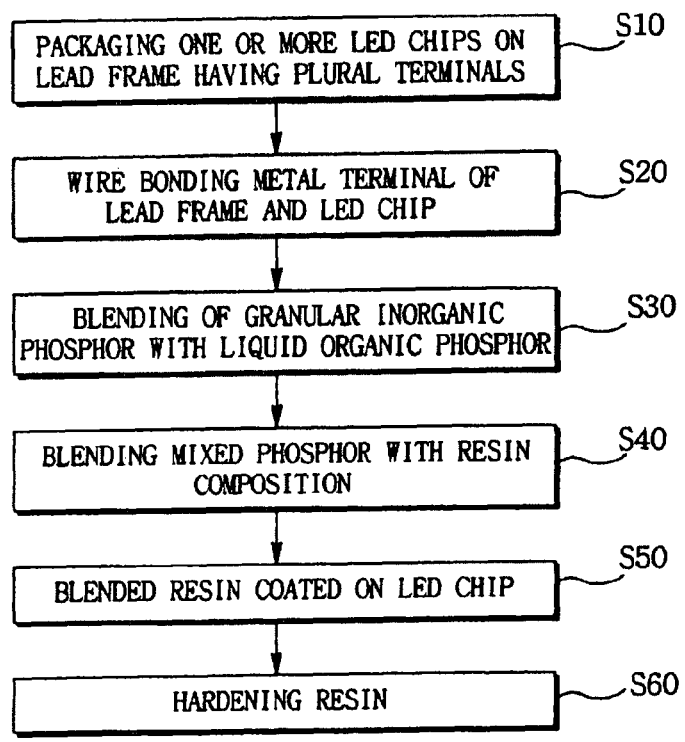
FIG. 2 is a fabricating process flow chart of a white LED according to the prior art.
Figure 3:
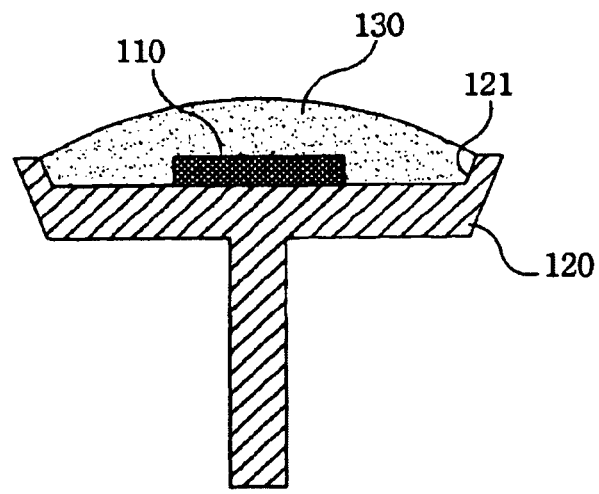
FIG. 3 is a schematic view of an LED coated with a polymeric resin in which organic phosphors are dissolved and inorganic phosphors are dispersed according to the present invention.

FIG. 3 is a schematic view of an LED coated with a polymeric resin in which organic phosphors are dissolved and inorganic phosphors are dispersed according to the present invention, where an LED (110) bonded to a cup-shaped reflector plate (121) of a lead frame (120) is encompassed and coated by polymeric resin in which organic phosphors are dissolved and inorganic phosphors are dispersed.

The organic and inorganic phosphors serve to absorb light emitted from the LED (110) and to convert the wavelength of the light. In other words, the light emitted from the LED (110) passes the organic and inorganic phosphors inherently contained in the polymeric resin, from which white light is emitted outside.

For example, if the LED (110) emits blue light and polymeric resin containing green and yellow organic and inorganic phosphors is coated with the LED, light that is emitted therefrom is white light, and if the LED (110) emits ultraviolet (UV) light, the LED is coated with polymeric resin containing red, green and blue organic and inorganic phosphors.

FIGS. 4a to 4d are manufacturing process cross-sectional views of a white LED according to the present invention.

Figure 4A:
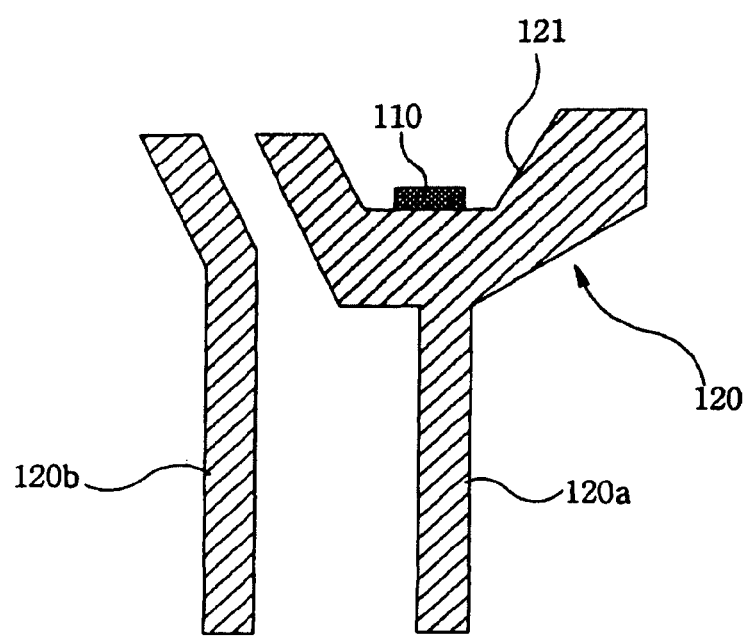
FIGS. 4a to 4d are manufacturing process cross-sectional views of a white LED according to the present invention.
Figure 4B:
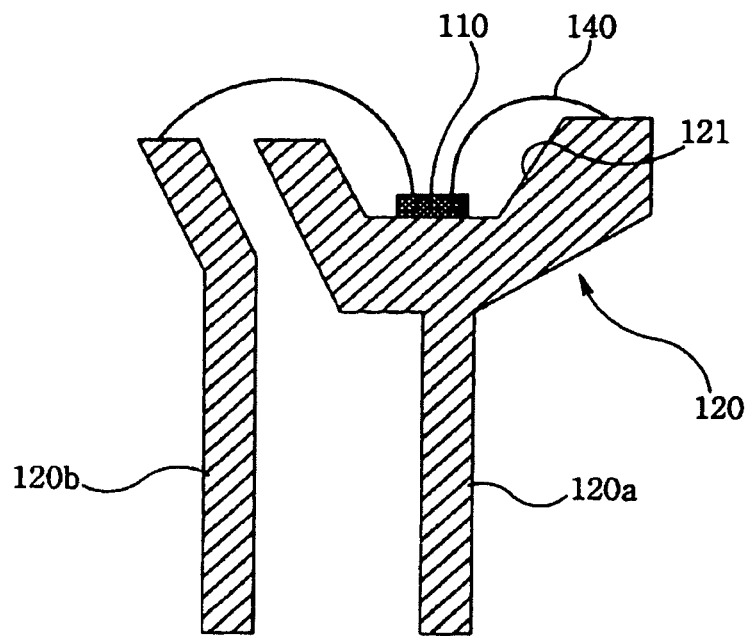
Figure 4C:
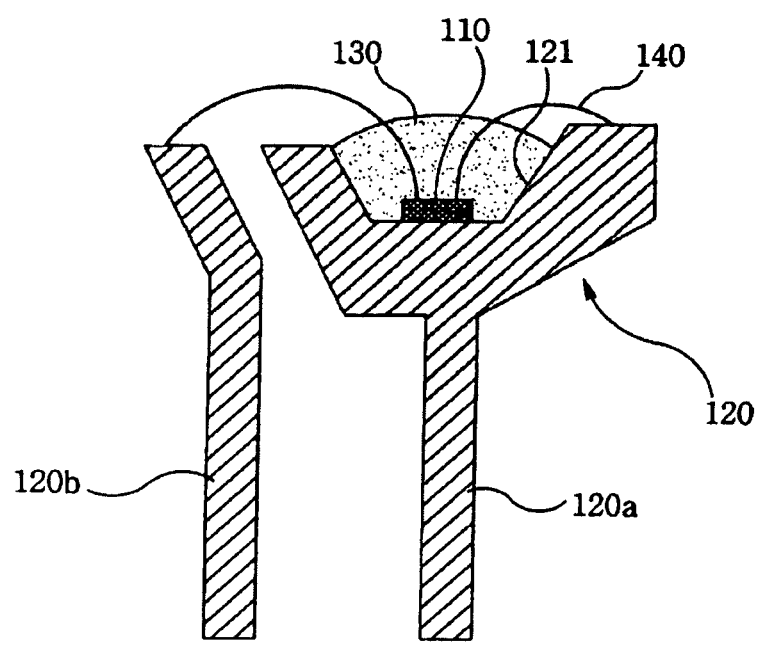

Referring to FIG. 4a, the reflector plate (121) of the lead frame (120) is bonded with the LED (110). The lead frame (120) is disposed with a pair of external lead terminals (120a. 120b), each spaced a predetermined distance apart. Then, the LED (110) and the lead frame (120) are bonded by a wire (140) (FIG. 4b). Successively, the reflector plate (121) of the lead frame (120) is coated with polymeric resin in which organic phosphors are dissolved and inorganic phosphors are dispersed in such a manner that the LED (110) can be encompassed (FIG. 4c). At this time, the organic phosphors are materials dissolvable in the polymeric resin such that the organic phosphors are organic low molecular phosphors or organic high molecular phosphors, all of which are organic phosphors dissolvable in the polymeric resin. The organic low molecular phosphors are phosphors having a molecular weight of less than 1,000 while the organic high molecular phosphors are phosphors having a molecular weight equal to or more than 1,000.

Preferably, the inorganic phosphor is one of YAG phosphor containing $Ce^{3+}$, TAG phosphor containing terbium or $Sr_2SiO_2$ phosphor containing Eu.

Meanwhile, in the process shown in FIG. 4c, in order to produce a polymeric resin in which organic phosphors are dissolved and inorganic phosphors are dispersed, it is preferred that the organic phosphors should be first dissolved in the polymeric resin and then, the inorganic phosphors should be dispersed.

Figure 4D:
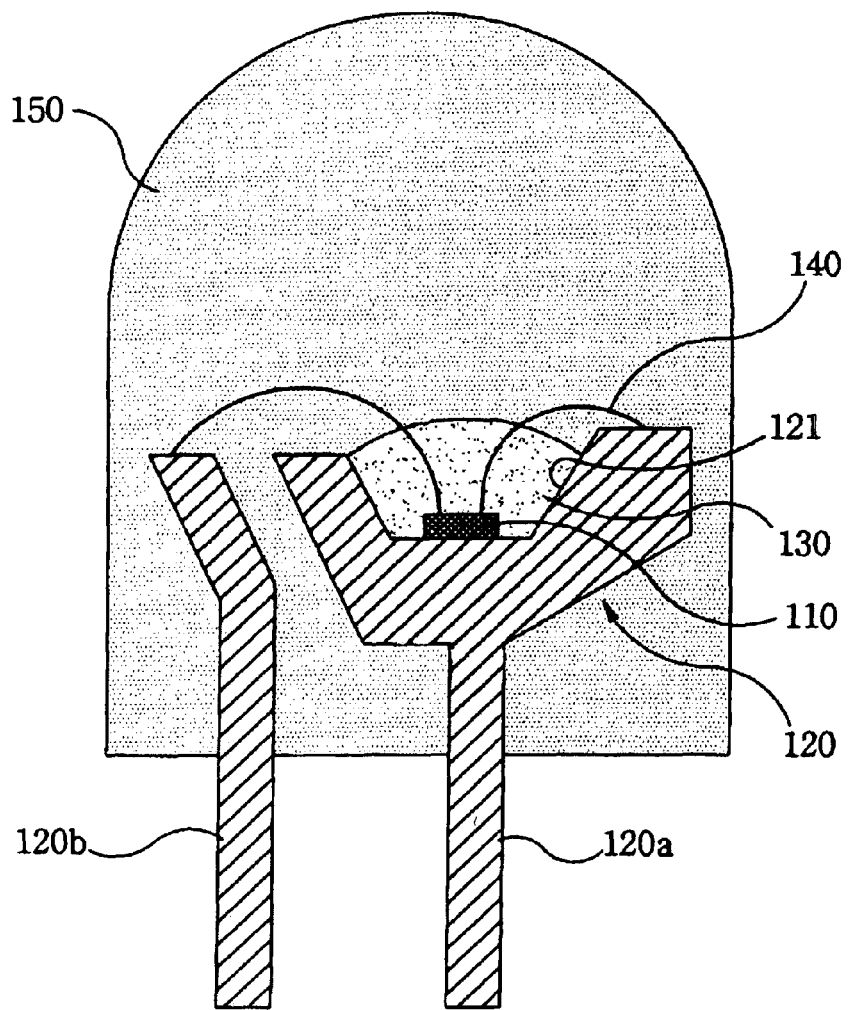

Successively, in order to protect the LED (110) from the outside environment, a molding process of encompassing the lead frame (120) as a transparent material is conducted (FIG. 4d).

Figure 5A:
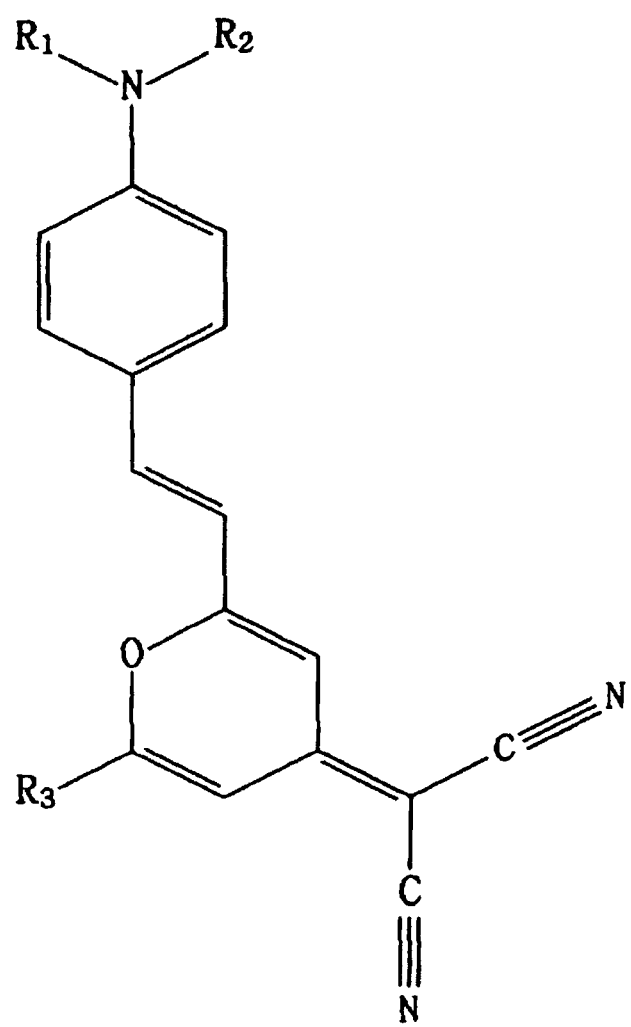
FIGS. 5a to 5c are representative structural views of organic phosphor according to the present invention.
Figure 5B:
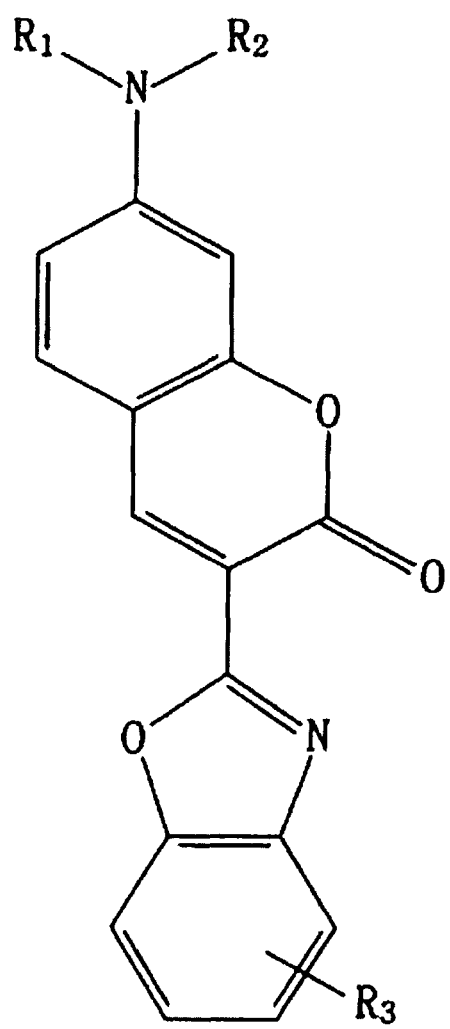
Figure 5C:
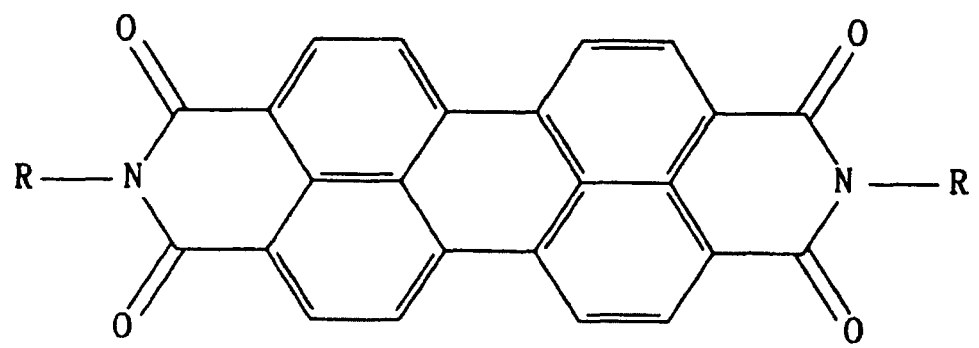

FIGS. 5a to 5c are representative structural views of organic phosphor according to the present invention, wherein, orange and red organic phosphors are DCM(4-dicyano methylene-2-alkyl-6-(p-dialkylaminostyryl-4-pyran) series as shown in FIG. 5a, and green and blue organic phosphors are representatively cumarine (2H-benzo-1-pyran-2-ones) series as shown in FIG. 5b.

R1, R2 and R3 shown in FIGS. 5a and 5b are functional groups such as Alkyl, Phenyl, Aryl, and Vinyl.

Furthermore, the yellow organic phosphors are perylene and cumarine series as illustrated in FIG. 5c, but they are limited to these molecules.

Figure 6A:
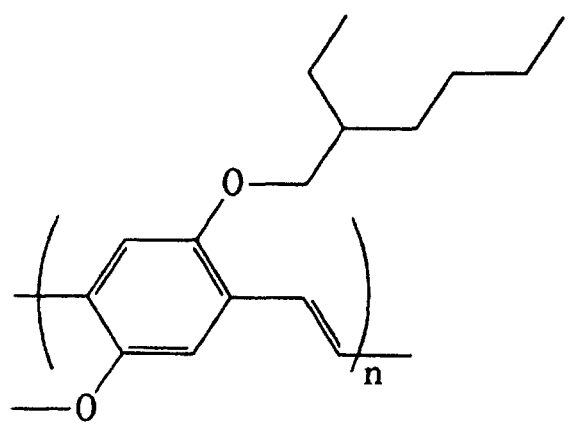
FIGS. 6a to 6d are representative structural views of organic polymeric phosphor according to the present invention.

FIGS. 6a to 6d are representative structural views of organic polymeric phosphor according to the present invention, where the organic polymeric phosphors may be, in case of orange, PPV derivatives, i.e., poly (2-methoxy-5-(2-ethylhexyloxy)-1,4-phenylenevinylene series as depicted in FIG. 6a.

Figure 6B:
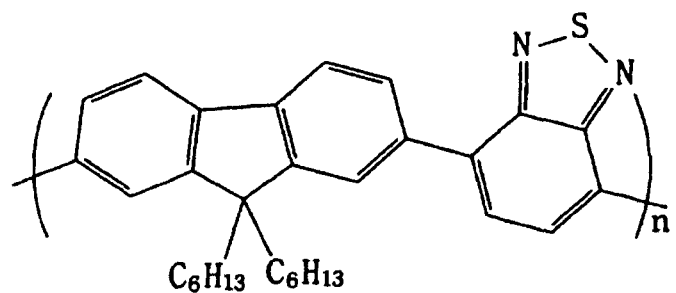

The representative molecular system for green polymeric phosphors may be poly {(9,9-dioctyl-2,7-divinylenefluorenylene)-alt-co-(2-methoxy-5-(2-ethylhexyloxy)-1,4-phenylene)} series introduced with fluorine and PPV groups at the same time, as shown in FIG. 6b.

Figure 6C:
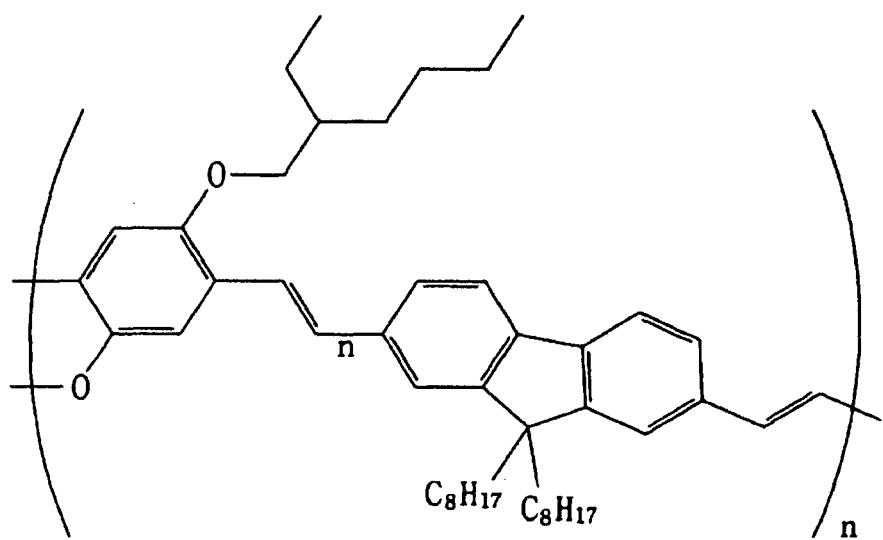
Figure 6D:
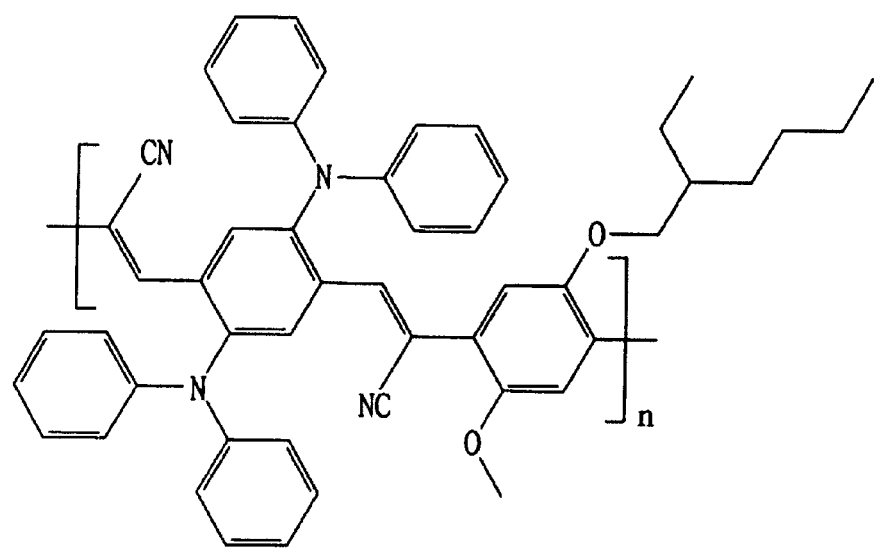

Furthermore, the Yellow polymeric phosphors may be, as illustrated in FIG. 6c, poly {(9,9-dihexylfluorenyl-2,7-diyl)-co-(1,4-benzo-(2,1,3)-thiadiazole)}, they are not limited these molecules. The red polymeric phosphors have a molecular structure as shown in FIG. 6d.

In order to select these organic phosphors, it is important that the absorption wavelength and the emission wavelength are matched, and stability with regard to heat and light and solubility with regard to used coating resin are important factors.

The organic phosphors recently developed show an excellent stability under a high temperature of over 200 degrees Celsius. The organic phosphors may be so designed as to be resistant to response with regard to excited light or ageing by appropriately restricting the used wavelength of light source, and to be appropriate in solubility with regard to various resins.

In addition, there is another advantage in that desired color temperature and color rendering index (CRI) can be easily tuned by appropriately adjusting the molecular structure change and the content ratio of red, green and blue colors of the organic phosphors.

However, there is a disadvantage in that, if density of the organic phosphors is increased, efficiency is decreased due to quenching effect and the organic phosphors are easily disintegrated due to internal heat of the organic molecules and weakness of resistance to light.

The organic and inorganic hybrids applied to the present invention can overcome the abovementioned disadvantages at a time because heat and light stability of the inorganic phosphors and light efficiency of organic phosphors can be simultaneously utilized to thereby expect the synergy effect.

Table 1 shows light emitting efficiency and color coordinate change with regard to ratio between polymeric resin and inorganic phosphor weight, and if the ratio of dispersing inorganic phosphors in the polymeric resin is in the range of 2~9 wt % out of total weight dispersed in the polymeric resin and the inorganic phosphors, the light emitting efficiency and color coordinate are deemed to be satisfactory.

TABLE 1

| INORGANIC PHOSPHOR WEIGHT | BRIGHTNESS(1 m) | CIEx | CIEy |
| --- | --- | --- | --- |
| 2.5 wt % | 1.49 | 0.26 | 0.24 |
| 4.0 wt % | 1.70 | 0.31 | 0.30 |
| 7.0 wt % | 1.83 | 0.37 | 0.38 |
| 9.0 wt % | 1.81 | 0.40 | 0.41 |

Table 2 shows light emitting efficiency and color coordinate change with regard to polymeric resin versus inorganic phosphor and organic phosphor weight ratio, and if inorganic phosphor weight is 3 wt % and 5 wt % out of the total weight where the inorganic phosphors and organic phosphors are contained in the polymeric resin, weight of the organic phosphors is respectively changed to 0.0005 wt %, 0.0012 wt % and 0.005 wt % and light emitting efficiency and color coordinate change are measured. As a result of the measurement, it is discriminated that all cases are deemed to be satisfactory.

TABLE 2

| INORGANIC PHOSPHOR WEIGHT | ORGANIC PHOSPHOR WEIGHT | BRIGHTNESS(1 m) | CIEx | CIEy |
|---|---|---|---|---|
| 3.0 wt % | 0.0005 | 1.72 | 0.30 | 0.30 |
| | 0.0012 | 1.94 | 0.30 | 0.33 |
| | 0.005 | 2.35 | 0.36 | 0.45 |
| | 0.0005 | 1.95 | 0.31 | 0.33 |
| 5.0 wt % | 0.0012 | 2.08 | 0.33 | 0.35 |
| | 0.005 | 2.43 | 0.38 | 0.45 |

As apparent from the foregoing, it is preferred in the present invention that the weight of the inorganic phosphor should be in the range of 2~9 wt %, and the weight of organic phosphor should be in the range of 0.0001~0.01 wt % out of the total weight of the inorganic phosphors and organic phosphors contained in the polymeric resin.

Preferred Embodiment

In the preferred embodiment of the present invention, a blue LED having a wavelength of 465 nm as a light source was used, green coumarin dye was used as inorganic phosphor and TAG phosphor containing terbium was used as inorganic phosphor.

At this time, following solution of organic phosphors in the polymeric resin, the polymeric resin dissolved therein with the organic phosphors was dispersed with inorganic phosphors and the blue LED was coated with the polymeric resin.

If the content of phosphor in the polymeric resin is increased, the amount of light is increased but diverts the scope of the color coordinate such that it is not appropriate to create a desired white light. For that reason, as earlier mentioned, preparation was made in such a manner that weight of the inorganic phosphor was arranged in the range of 2~9 wt %, and weight of organic phosphor was arranged in the range of 0.0001~0.01 wt %.

The organic phosphor thus prepared was evenly dissolved through agitation for a predetermined period of time so that it could be dissolved into the thermosetting epoxy resin via complete dispersion. Then, the thermosetting epoxy resin dissolved therein with the organic phosphor was poured with a predetermined amount of inorganic phosphor and agitated for a complete dispersion, whereby polymeric resin dissolved therein with organic phosphor and dispersed with inorganic phosphor was manufactured.

In the preferred embodiment of the present invention, the organic phosphor is dissolved in the coated resin to enable to prevent the light loss caused by scattered particles and to attain a high light efficiency.

The polymeric resin in which organic phosphors thus manufactured are dissolved and inorganic phosphors are dispersed was coated on an upper surface of the blue LED and hardened at 200 degrees Celsius for over three hours to thereby enable to manufacture a white LED.

Figure 7A:
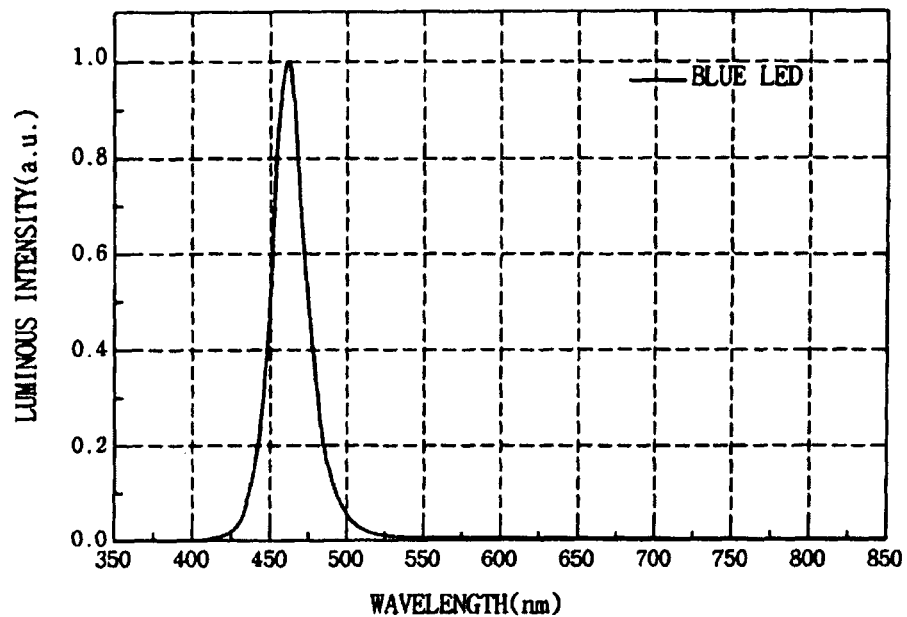
FIGS. 7a to 7b are measuring views of a light emitting spectrum of a blue LED coated with or not coated with polymeric resin containing inorganic phosphor or organic phosphor according to the present invention.
Figure 7B:
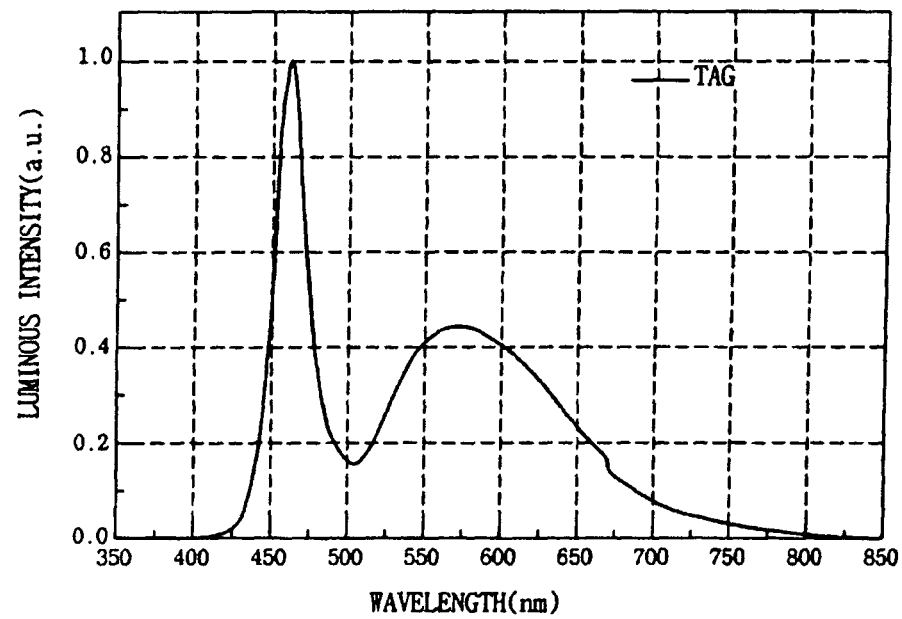
Figure 7C:
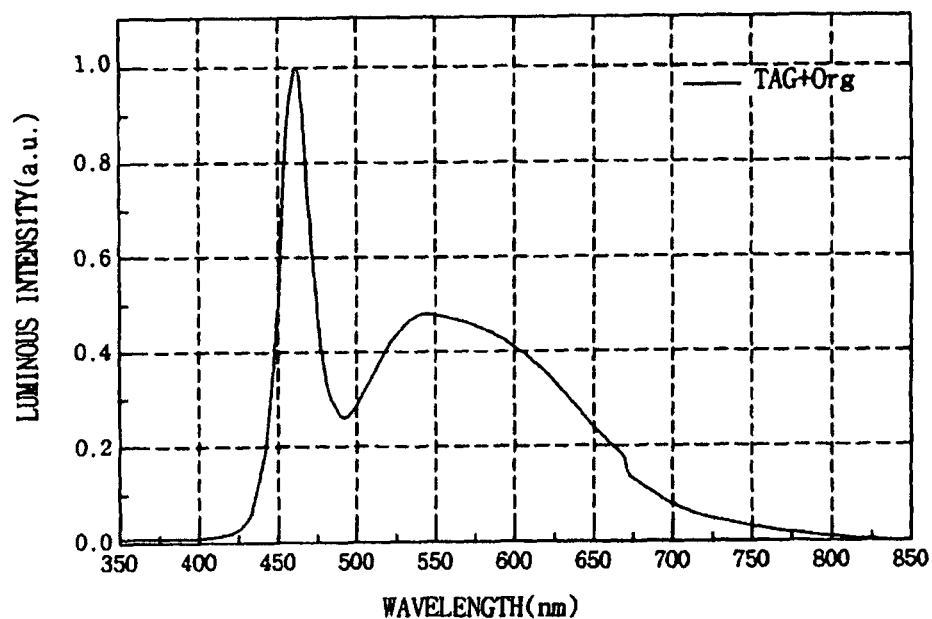

A light emitting spectrum of the white LED thus manufactured is so measured as is shown in FIG. 7c.

Meanwhile, FIG. 7a is a blue spectrum of a blue LED in which a maximum light emission peak is 465 nm.

Furthermore, FIG. 7b shows a measurement of a white light spectrum for an LED coated with polymeric resin contained only with inorganic phosphor (TAG), where it can be noted that the maximum light emission peak of the phosphor is 570 nm, which shows a little bit of shift to red.

Furthermore, FIG. 7c shows a white light spectrum of an LED coated with polymeric resin contained with inorganic phosphor and organic phosphor, and if compared with FIG. 7b where polymeric resin is contained with only inorganic phosphors, it can be newly noted that a maximum light emission peak appears at 540 nm.

Figure 7D:
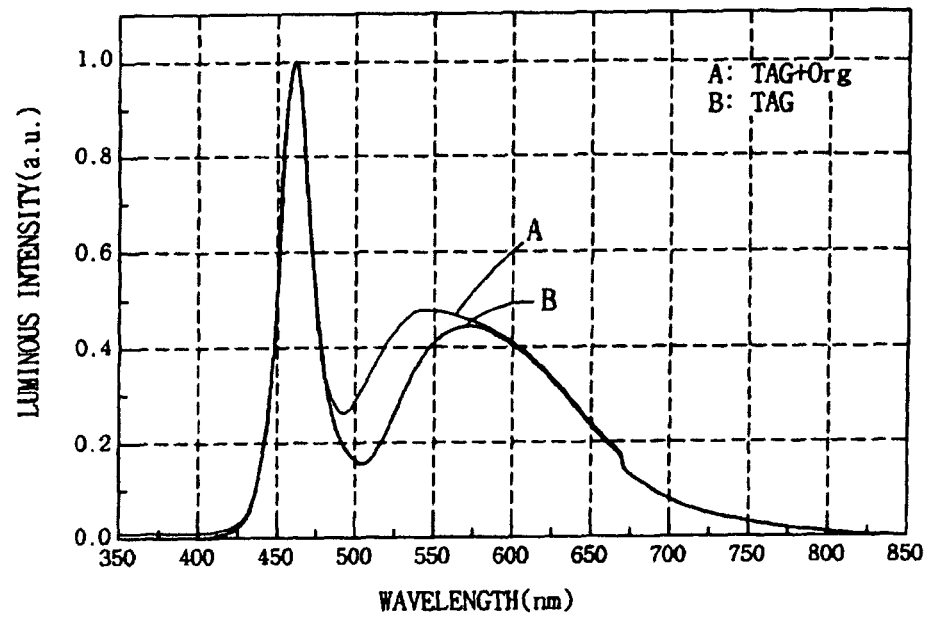

Moreover, FIG. 7d is an overlap of two white light spectrums in FIGS. 7b and 7c, where 'A' is a spectrum of an LED coated with polymeric resin containing organic and inorganic phosphors (FIG. 7c), and 'B' is a spectrum of an LED coated with polymeric resin containing with only inorganic phosphor (FIG. 7b), such that 'A' could have an effect of overall increase of light emission strength because of much reinforcement of green light by the organic phosphor compared with 'B'.

Figure 8A:
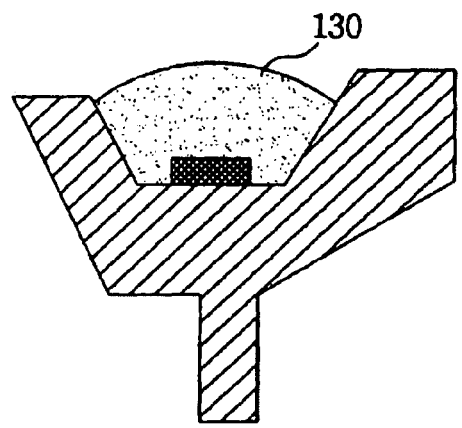
FIGS. 8a to 8c are cross-sectional views of an LED encompassed by polymeric resin in which organic phosphors are dissolved and inorganic phosphors are dispersed, where a lead frame is coated by the polymeric resin according to the present invention.
Figure 8B:
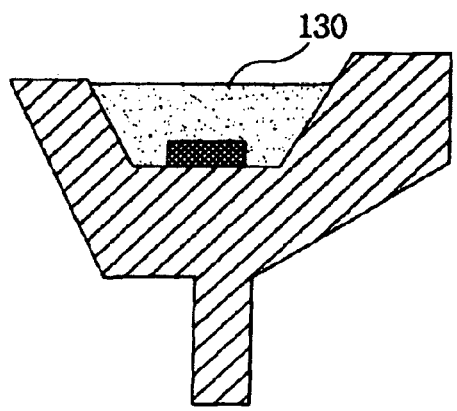
Figure 8C:
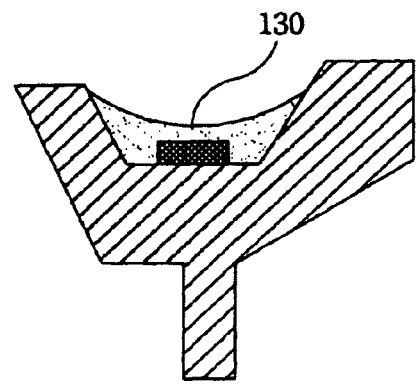

FIGS. 8a to 8c are cross-sectional views of an LED encompassed by polymeric resin in which organic phosphors are dissolved and inorganic phosphors are dispersed, where a lead frame is coated by the polymeric resin according to the present invention.

In the figures, the LED can irradiate blue light or UV light, and the LED is packaged in a cup-shaped reflector plate of a lead frame, and organic phosphors are dissolved and polymeric resin in which inorganic phosphors are dispersed are coated thereon.

The to-be-coated polymeric resin may contain photoluminescence phosphor which absorbs some of the light emitted from the LED and converts the wavelength of the light to emit fluorescent light.

Furthermore, the polymeric resin should be of a material which does not turn yellow even at a high temperature for a long time and should be excellent in heat-resistance, light fastness and weatherability, such that the polymeric resin is preferred to be of UV or thermosetting resin.

Referring to FIG. 8a, a method of coating the polymeric resin (130) is to coat the LED in such a manner that an exposed surface looks like a convex lens, or a planar shape as in FIG. 8c, or a concave lens as in FIG. 8c.

If a shape of the exposed surface of the coated polymeric resin looks like a convex lens, light can be widely emitted, and if it looks like a concave lens, the light can be collected and emitted.

Figure 9:
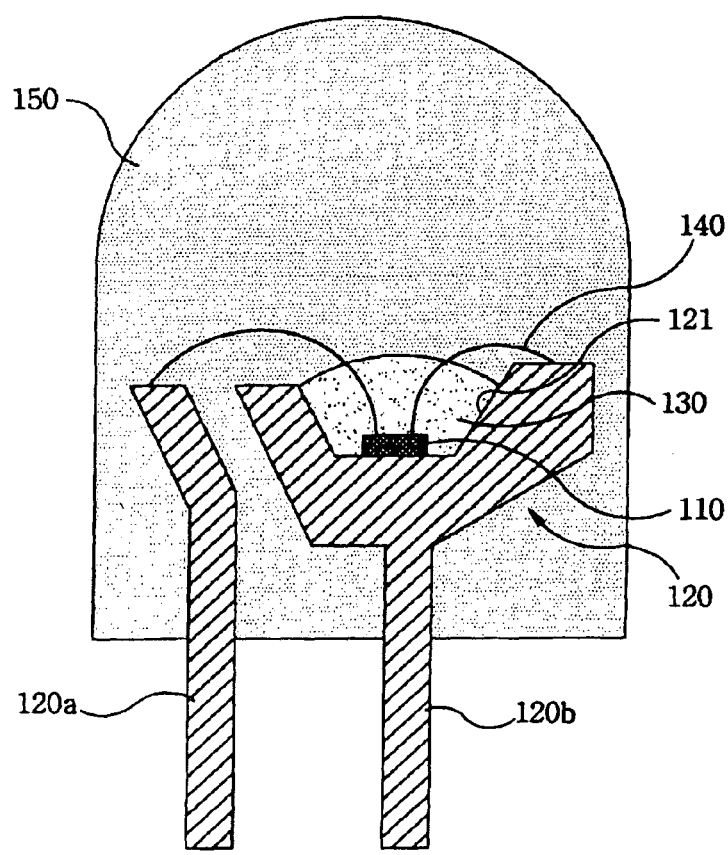
FIG. 9 is a cross-sectional view of a white LED according to the present invention.

FIG. 9 is a cross-sectional view of a white LED according to the present invention. The white LED comprises: a lead frame (120) having a pair of external lead terminals (120a. 120b), each spaced a predetermined distance apart, and one tip end of the external lead terminal (120b) being formed with a cup-shaped reflector plate (121); a LED (110) bonded to the reflector plate (121) of the lead frame (120); a wire (140) electrically connecting the LED (110) to a pair of external lead terminals (120a. 120b) of the lead frame (120); polymeric resin (130) encompassing the LED (110) and coated with the reflector plate (121) and in which organic phosphors are dissolved and inorganic phosphors are dispersed; and a molding part (150) so molded as to encompass the polymeric resin (130), the entire length of the wire (140) and part of the lead frame (120).

Preferably, the molding material of the molding part (150) should be of transparent resin that does not yellow even at a high temperature for a long time, such as epoxy resin or silicon resin or the like. If necessary, at least one or more materials out of light stabilizer, antioxidant, heat stabilizer are preferred to be included in the resin of the molding part.

Preferably, the heat stabilizer includes barium zinc or calcium-zinc, and antioxidant includes phenol, thio, or phosphorous groups, or may select one of these materials.

In addition, if the molding part (150) includes organic and inorganic phosphors, the light emitted from the LED is color-converted and emitted by the organic and inorganic phosphors contained in the polymeric resin. As a result, the white LED according to the present invention can emit white light.

Figure 10:
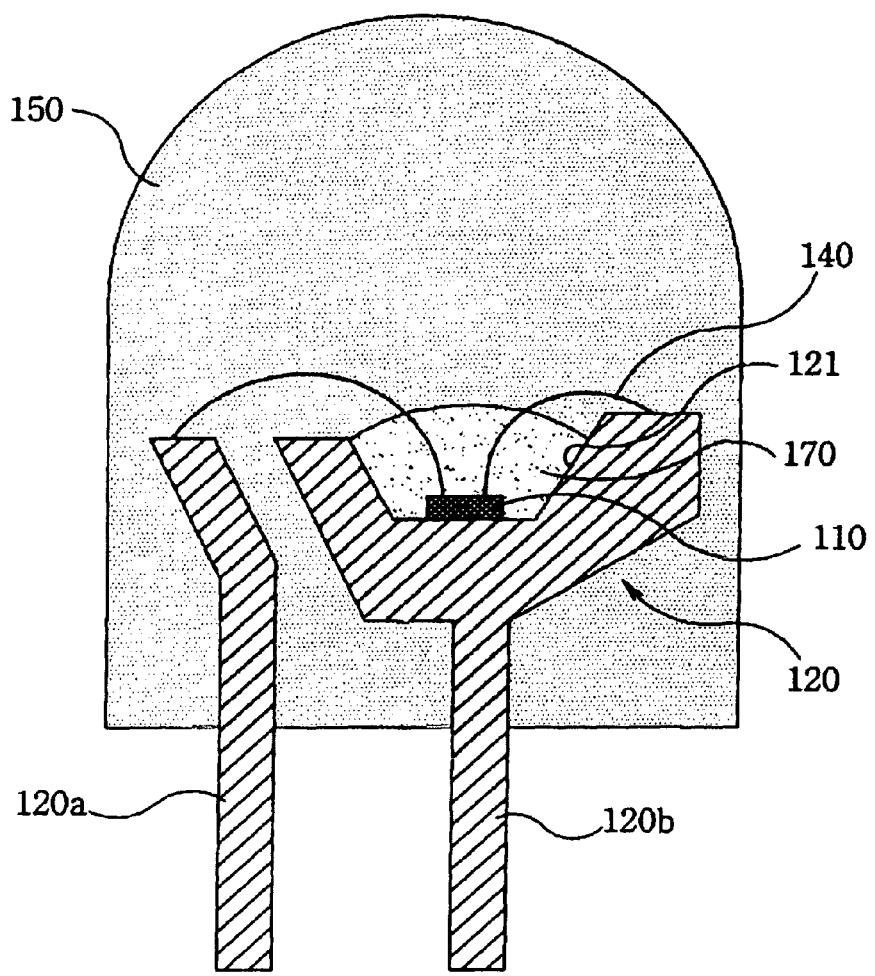
FIG. 10 is a cross-sectional view of a white LED coated with polymeric resin further containing organosilicates in addition to phosphor according to the present invention.

FIG. 10 is a cross-sectional view of a white LED coated with polymeric resin further containing organosilicates in addition to phosphor according to the present invention, where the white LED is formed by coating the polymeric resin (170) containing phosphors and organosilicates on the LED (110).

If the organosilicates are contained in the polymeric resin, the heat created by using elements for a long time and ageing of the elements caused by the optical energy can be reduced. In other words, the organosilicate, being a transparent material, can protect the phosphors against the heat and light, thereby enabling to reducing the ageing of the elements, if the polymeric resin is dispersed therein with the organosilicate. The organosilicate is preferred to have porous channels in which phosphors can be contained.

Preferably, the organosilicate is mesoporous silica. The organosilicate is known material such that any organosilicate currently commercialized is acceptable in the present invention.

Meanwhile, even if the organosilicate is contained in the polymeric resin, and because it is excellent in optical transmission factor and compatibility with binder of the polymeric resin, there is no problem with the organosilicate mixed into the existing process. Another advantage is that there is no problem of reduced luminance and color coordinate in the elements, only to have an effect of selectively improving the credibility.

Although there is no specific limitation of required content for organosilicate, the organosilicate is preferred to have a weight in the range of 1~30 wt % out of the total weight of the polymeric resin inherently contained with the phosphor. The content of the organosilicate differs according to the weight of the phosphor contained in the polymeric resin, which is closely related with the ratio adjustment of red, green and blue phosphors for creating the white LED.

Preferably, the LED is a blue LED or a UV LED.

A method of manufacturing a white LED comprises the steps of: dissolving organic phosphors and organosilicates in polymeric resin; dispersing inorganic phosphors in the polymeric resin dissolved therein with the organic phosphors and the organosilicates; and encompassing an LED with the polymeric resin dissolved therein with the organic phosphors and the organosilicates and dispersed therein with inorganic phosphors, and coating the LED with the polymeric resin.

The step of encompassing and coating the LED with the polymeric resin further comprises a step of hardening the polymeric resin, whereby the organic phosphors and the inorganic phosphors are hardened, being contained in the porous channels of the organosilicates.

Figure 11:
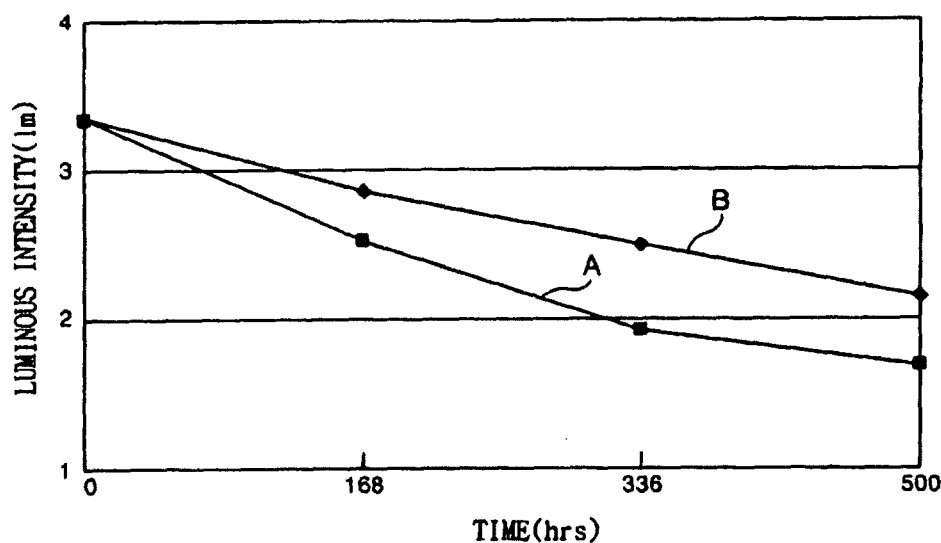
FIG. 11 is a graph that shows measurements of a luminous intensity of an element formed by being coated with polymeric resin containing organosilicates and of an element formed by being coated with polymeric resin not containing the organosilicates under high temperature and high humidity condition according to the present invention.
Figure 12:
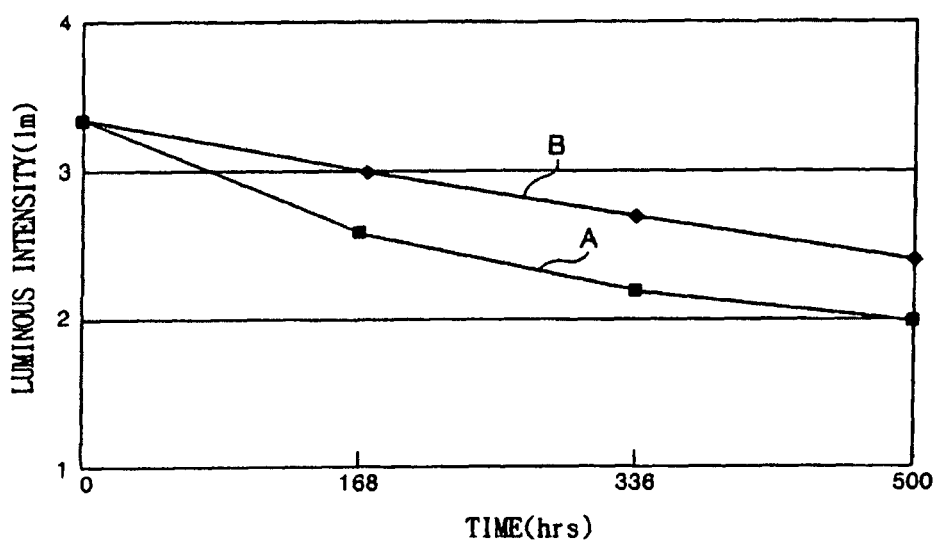
FIG. 12 is a graph that shows measurements of a luminous intensity of an element formed by being coated with polymeric resin containing organosilicates and of an element formed by being coated with polymeric resin not containing the organosilicates under a room temperature according to the present invention.

FIG. 11 is a graph that shows measurements of a luminous intensity of an element formed by being coated with polymeric resin containing organosilicates and of an element formed by being coated with polymeric resin not containing the organosilicates under high temperature and high humidity condition according to the present invention, and FIG. 12 is a graph that shows measurements of a luminous intensity of an element formed by being coated with polymeric resin containing organosilicates and of an element formed by being coated with polymeric resin not containing the organosilicates under a room temperature according to the present invention.

First of all, 'A' graph shows a measurement of an element coated with polymeric resin contained therein with organic and inorganic phosphors, and 'B' graph shows a measurement of an element coated with polymeric resin contained therein with organosilicate, organic and inorganic phosphors.

The organosilicate comprises 10 wt % of the total weight of the polymeric resin including the organosilicate and phosphors.

It can be noted that an element contained with organosilicate is less decreased in luminous intensity than that of without organosilicate when the luminous intensity was measured (FIG. 11) under high temperature (60 degrees Celsius) and high humidity (90%) and under room temperature (FIG. 12).

In other words, we can notice that an element coated with polymeric resin contained with organosilicate can better withstand the degradation than that of polymeric resin without organosilicate in terms of improvement effect of 30~40%.

As apparent from the foregoing, the present invention has created a white LED coated with polymeric resin in which organic phosphors are dissolved and inorganic phosphors are dispersed, thereby producing an effect of excellent luminance and color coordinate without creating a compatibility problem with the polymeric resin.

There is another advantage in that a white LED with a high luminance and a long service life can be embodied using polymeric composition containing organic and inorganic phosphors, organic and inorganic combined phosphors, and organosilicates.

There is still another advantage in that an epoch making improvement in terms of luminance and credibility can be made without additional process added to an existing element fabricating process, thereby enabling to achieve price competitiveness through cost reduction.

The foregoing description of various embodiments of the present invention has been presented for purposes of illustration and description. it is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A white light emitting device, the device comprising:
a light emitting diode (LED); and
a polymer resin encompassing the LED,
wherein the polymer resin comprises organic phosphors, inorganic phosphors, and organosilicates,
wherein the organic phosphors are dissolved in the polymer resin and particles of both the inorganic phosphors and the organosilicates are dispersed in the polymer resin,
wherein each of the organosilicates has porous channels for containing each of the inorganic phosphors therein, and
wherein the weight of the inorganic phosphors is 2~9 wt % while the weight of the organic phosphors is 0.0001~0.01 wt % out of the total weight of the polymer resin.

2. The device of claim 1, wherein the organosilicates are in the range of 1~30 wt % out of the total weight of the polymer resin that comprises the organic phosphors and the inorganic phosphors.

3. The device of claim 1, wherein the organosilicates are in the range of 5~15 wt % out of the total weight of the polymer resin that comprises the organic phosphors and the inorganic phosphors.

4. The device of claim 1, wherein the LED is a blue LED or an ultraviolet (UV) LED.

5. The device of claim 1, wherein a surface of the polymer resin takes a shape of any one of a convex lens, a planar shape, or a concave lens.

* * * * *